United States Patent [19]
Slocum et al.

[11] Patent Number: 5,839,769
[45] Date of Patent: Nov. 24, 1998

[54] EXPANDING GRIPPER WITH ELASTICALLY VARIABLE PITCH SCREW

[75] Inventors: Alexander H. Slocum, Bow, N.H.; R. Scott Ziegenhagen, II, San Jose, Calif.

[73] Assignee: Kinetrix, Inc., Bedford, N.H.

[21] Appl. No.: 726,069

[22] Filed: Oct. 3, 1996

[51] Int. Cl.[6] ............................................. B65B 35/38
[52] U.S. Cl. ......................... 294/87.1; 294/65; 414/416; 414/750
[58] Field of Search ............................. 414/403, 416, 414/750, 938; 294/65, 87.1

[56] References Cited

U.S. PATENT DOCUMENTS

| | | | |
|---|---|---|---|
| 3,302,967 | 2/1967 | Harris et al. | 294/65 |
| 3,506,140 | 4/1970 | Koch et al. | |
| 3,542,224 | 11/1970 | Warren. | |
| 3,542,412 | 11/1970 | Koch et al. | 294/65 |
| 3,610,673 | 10/1971 | Strombeck et al. | 294/65 |
| 3,860,280 | 1/1975 | Karlsson | 294/87 R |
| 3,861,732 | 1/1975 | Piper | 294/65 |
| 3,920,128 | 11/1975 | Baker. | |
| 3,934,920 | 1/1976 | Rowekamp | 294/87 R |
| 4,444,423 | 4/1984 | Montferme et al. | 294/87 R |
| 4,444,424 | 4/1984 | Lebret | 294/87 R |
| 4,449,885 | 5/1984 | Hertel et al. | 414/750 |
| 4,545,125 | 10/1985 | Rogers et al. | 33/572 |
| 4,586,247 | 5/1986 | Murai et al. | 414/750 X |
| 4,597,819 | 7/1986 | Kusuhara et al. | 294/87.1 X |
| 4,732,376 | 3/1988 | Umezawa | 271/267 |
| 4,744,595 | 5/1988 | Tonning et al. | 294/65 |
| 4,787,662 | 11/1988 | Dewez | 294/64.1 |
| 4,957,406 | 9/1990 | Akagawa | 414/416 |
| 5,007,788 | 4/1991 | Asano et al. | 294/87.1 X |
| 5,188,499 | 2/1993 | Tarng et al. | 414/416 X |
| 5,284,413 | 2/1994 | Wilkinson et al. | 414/416 |
| 5,290,134 | 3/1994 | Baba | 414/416 X |
| 5,639,203 | 6/1997 | Lee | 414/416 |

FOREIGN PATENT DOCUMENTS

| | | | |
|---|---|---|---|
| 0 239 547 A | 9/1987 | European Pat. Off. | |
| 62-136433 | 6/1987 | Japan | 414/403 |
| 1255242 | 10/1989 | Japan | 414/938 |
| 3273662 | 12/1991 | Japan | 414/938 |
| 2207413 | 2/1989 | United Kingdom | 294/65 |

Primary Examiner—James W. Keenan
Attorney, Agent, or Firm—Edmund J. Walsh

[57] ABSTRACT

An expandable gripper for semiconductor processing equipment that allows the pitch between semiconductor chips to be adjusted. To adjust the pitch, several pick and place mechanisms are mounted around a shaft using nuts. The threads of the nuts have variable leads, causing each to travel a different amount as the shaft rotates. All of the threads engage the shaft because a compliant layer is attached to the shaft.

17 Claims, 2 Drawing Sheets

EXPANDING GRIPPER WITH ELASTICALLY VARIABLE PITCH SCREW

This invention relates generally to handling devices and more particularly to devices used to handle semiconductor components during their manufacture.

Semiconductor components are manufactured in a series of process steps, each step often being performed by a different type of machine. The semiconductor components are moved from machine to machine, often being transported in trays. Each tray usually carries more components than a particular machine can operate on at one time. Thus, there is a need to transfer the semiconductor components from the transport trays to a device that holds the appropriate number of components for each machine. Many semiconductor processing machines include a "loader" to perform this function.

When the machine processes multiple semiconductor components at one time, it often uses a machine tray to hold the appropriate number of components. The spacing between the components in the machine tray matches the spacing required by the machine. Thus, the loader not only transfers the semiconductor components from the transport tray to the machine tray, it also must adjust the spacing between the components, sometimes called the "pitch".

For example, a transport tray might hold 100 components in a tightly packed grid with a 2 cm pitch. A semiconductor tester might test eight parts at a time at a test head with a 5 cm pitch. Thus, the loader would transfer semiconductor components from the transport tray to a machine tray in groups of eight. In doing so, it would have to increase the spacing between the components from 2 cm to 5 cm.

One simple way that this transfer has been made is with a "pick and place" device. The pick and place picks up one component at a time from the transfer tray and places it in the machine tray. Once eight components are moved to one machine tray, the next tray is loaded.

The drawback of this approach is speed. It can take on the order of seconds to move one component between trays. The testing operation should be performed in a matter of a few seconds. Thus, if there are more than a few components in the machine tray, loading the machine tray becomes a bottleneck in the testing operation and reduces throughput of the manufacturing process. Because of the high capital cost for a semiconductor manufacturing facility in comparison to the selling price of a semiconductor component, it is extremely important that throughput be maintained.

One way that loaders are built to maintain high throughput is by transferring multiple components at one time. Generally, several pick and place mechanisms are ganged together in a row. The positions of the pick and place mechanisms can be adjusted to alter the pitch. In use, the pick and place mechanisms are set to a first pitch to pick up the semiconductor components. Then, the pitch of the pick and place mechanisms is altered to match the pitch of the machine tray and the components are placed in the tray. In this way, rows of components can be transferred at a time, significantly reducing the load time. U.S. Pat. No. 5,290,134 to Baba entitled "Pick and Place For Automatic Test Handler" is an example of such a pick and place device. That patent describes a set of pick and place devices attached to a pantograph which adjusts the spacing between the pick and place devices.

A pantograph system, however, is complex and can be inaccurate. The pantograph changes the height of the grip point as a function of the spacing unless complicated bearing mechanisms are used. Further, the large number of links increases the chance of wear and failure. Furthermore, it is not readily adapted in a two dimensional array.

Existing expanding grippers are generally too bulky or imprecise for easy use in a semiconductor manufacturing operation. It would be desirable to simply and inexpensively manufacture an expanding gripper.

It would also be desirable to transfer more than a single row of components at a time with a high degree of accuracy. If this were possible, the loading operation could be speeded up even more.

SUMMARY OF THE INVENTION

With the foregoing background in mind, it is an object of the invention to provide an expanding gripper.

It is a further object to provide a low cost gripper.

It is also an object to provide a gripper that can be expanded in two dimensions.

The foregoing and other objects are achieved in a gripper having a plurality of pick and place mechanisms mounted around a shaft with nuts having different leads. There is a compliant material, fixed to the shaft, between the nuts and the shaft, allowing each of the nuts to engage the shaft despite their differing leads.

In one embodiment, a plurality of shafts are aligned in parallel. The shafts are mounted at their ends to blocks around a similarly formed end shaft. The blocks likewise have nuts with differing leads and the end shaft has a similar compliant layer. The end shaft can be rotated to adjust the spacing between the shafts, thereby allowing the pitch between the shafts to be controlled.

BRIEF DESCRIPTION OF THE DRAWINGS

The invention will be better understood by reference to the following more detailed description and accompanying drawings in which.

DESCRIPTION OF THE PREFERRED EMBODIMENT

Figure 2:
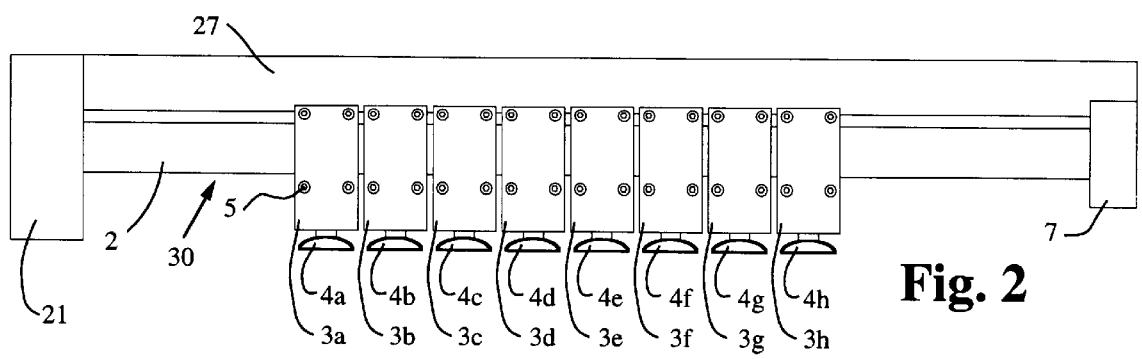
FIG. 2 is a side view of a plurality of pick and place mechanisms in a contracted position.

FIG. 2 shows an expanding gripper 30 designed to pick up a row of semiconductor components at one time. A plurality of pick and place mechanisms 4a . . . 4h are mounted on nuts 3a . . . 3h, respectively. FIG. 2 shows that there are eight such pick and place mechanisms, however, the actual number might vary depending on the application.

Pick and place mechanisms 4a . . . 4h are as in the prior art. They could be vacuum operated pick and place devices. However, magnetic pick-ups or other pick and place mechanisms could be used.

Figure 3:
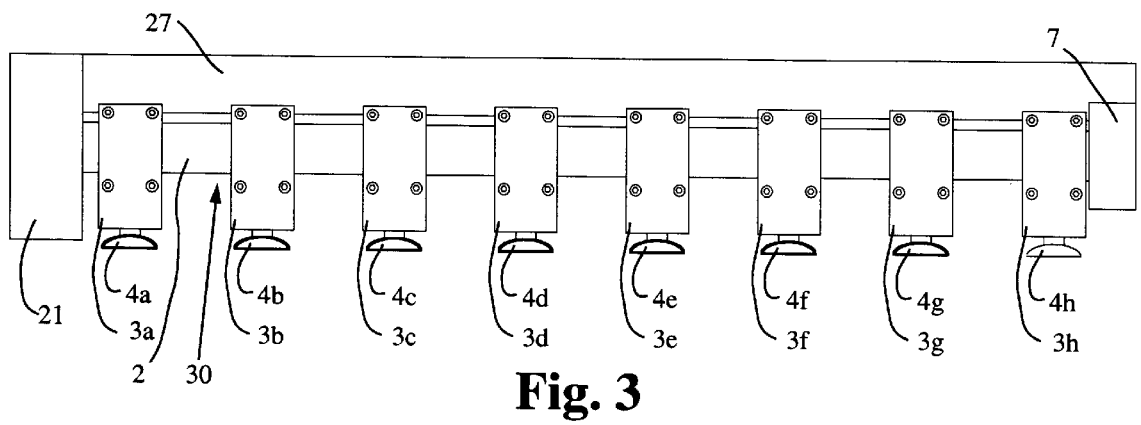
FIG. 3 is a side view of the plurality of pick and place mechanisms of FIG. 2 in an expanded position.

FIG. 2 shows the pick and place mechanisms 4a . . . 4h in a fully contracted position. FIG. 3 shows expanding gripper 30 with the pick and place mechanisms 4a . . . 4h in a fully expanded position. In each case, the spacing between adjacent pick and place elements is the same, though that spacing has been changed.

Figure 1:
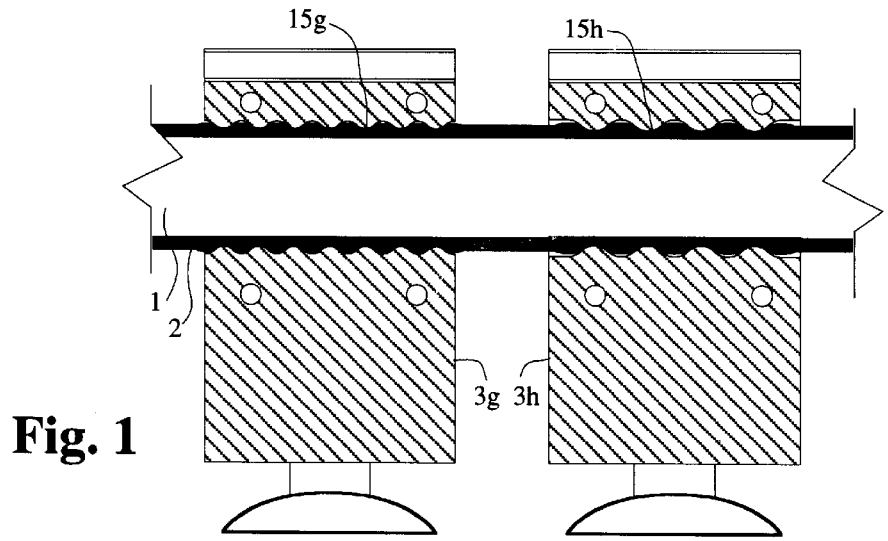
FIG. 1 is a cross section of pick and place mechanisms mounted to a shaft according to the invention.

FIG. 1 illustrates how the desired spacing between pick and place elements 4a . . . 4h can be achieved. FIG. 1 shows in cross section two adjacent nuts 3g and 3h. The nuts have threads 15g and 15h, respectively.

Threads 15g and 15h are formed in any convenient manner and are preferably sinusoidal threads. One possible way to make the threads is to use metal cutting taps to tap aluminum blocks. The aluminum blocks could then be anodized and the surface treated with a TEFLON® impregnation process in what is sometimes called "hardcoating." Injection molding with a low-friction plastic such as a fluoropolymer is also a possible way to make nuts with threads 15g and 15h.

Shaft 1 passes through nuts 3a . . . 3h with the threads 15g and 15h around shaft 1. A compliant layer 2 is between threads 15g and 15h. Shaft 1 has no fixed threads. The threads 15g and 15h engage compliant layer 2, deforming compliant layer 2 to mate with threads 15g and 15h. To reduce the possibility that threads such as 15g and 15h will cut or wear compliant layer 2, the threads are sinusoidal.

Compliant layer 2 is formed of an elastomeric material. An example of a suitable elastomeric material is Buna N rubber, which is commonly used in O rings.

Compliant layer 2 is fixed to shaft 1. Where rubber is used to make compliant layer 2, shaft 1 might be rubber coated. Compliant layer 2 will therefore rotate as shaft 1 rotates. Because compliant layer 2 deforms to mate with threads 15g and 15h, nuts 3g and 3h will be driven as shaft 1 rotates. The amount of linear translation of a nut, such as 3g or 3h, depends on the lead of the threads 15g or 15h.

Compliant layer 2 will be deformed only in the area where one of the nuts 3a . . . 3h is located. This allows the threads 15g and 15h to have different leads. Compliant layer 2 will deform to match the threads regardless of the lead. Once one of the nuts 3a . . . 3h is driven past a particular point on shaft 1, compliant layer 2 will return to its undeformed state. If another of the nuts 3a . . . 3h is driven over that point at a later time, compliant layer 2 will conform to the threads on that nut as well.

FIG. 1 shows that threads 15g and 15h have different leads. The threads of each nut 3a . . . 3h have leads related to their position on the expanding gripper. Different leads are required because the different nuts 3a . . . 3h require different amounts of linear travel between the contracted position of FIG. 2 and the expanded position of FIG. 3. For example, nut 3a and 3h at the ends of the expanding gripper move a greater distance than the nuts 3d and 3e near the center of the expanding gripper. Therefore, nuts 3a and 3h have threads with the largest leads.

In order to keep the spacing between adjacent ones of the pick and place units 4a . . . 4h equal, each nut 3a . . . 3h must have a lead which differs from an adjacent nut by a constant amount, ΔL. It should be noted that, in moving from the position of FIG. 2 to the position of FIG. 3 some of the nuts 3a . . . 3h moved to the left and some moved to the right. Movement in opposite directions is possible with nuts having left or right handed threads. For computing leads of the threads, left handed threads could be thought of as having negative leads and right handed threads could be thought of as having positive leads. If a thread has a zero lead, then the nut does not move when shaft 1 rotates.

In order to provide rotation of shaft 1, one end of the shaft is held in bearing support 7. The other end of shaft 1 is mounted to a motor 21. Motor 21 is rotated clockwise or counter clockwise to expand or contract the expanding gripper 30.

Figure 4:
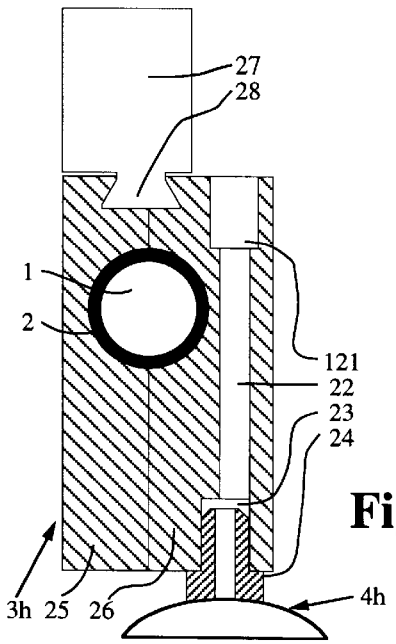
FIG. 4 is a cross sectional view along the line 4—4 in FIG. 3.

Each of the nuts 3a . . . 3h engages a top bar 27 which prevents the nuts from rotating as shaft 1 rotates. FIG. 4, showing a cross section of nut 3h for illustration, shows that top bar 27 contains a dove tail 28. Dove tail 28 fits into a groove (not numbered) in nut 3h, thereby preventing rotation of nut 3h around shaft 1 while still allowing translational motion along shaft 1. The other nuts 3a . . . 3g are all made similarly.

FIG. 4 shows that nut 3h is made with two molded halves 25 and 26. To assemble expanding gripper 30, the two halves 25 and 26 are fitted together around shaft 1 and dove tail 28. The two halves are held together, such as by bolts 5 (FIG. 2).

FIG. 4 also shows a preferred embodiment of pick and place mechanism 4h. Vacuum passage 22 is integrally molded into molded half 26. Vacuum passage 22 is terminated at an upper end in a counter bore 121 for attachment to a vacuum port. Vacuum passage 22 is terminated at its lower end in counter bore 23 to receive vacuum gripper 24.

Figure 5:
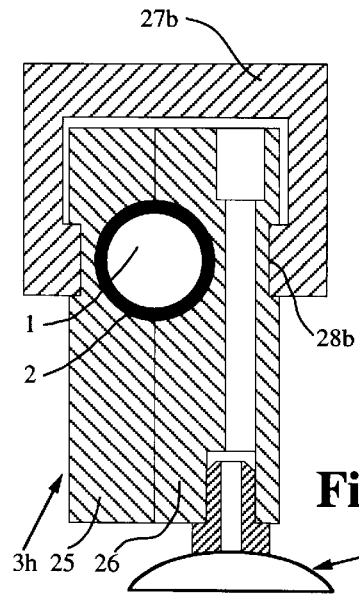
FIG. 5 is an alternative embodiment of the attachment mechanism of FIG. 4.

FIG. 5 shows an alternative embodiment having top bar 27b. The embodiment of FIG. 5 uses a bearing rail 28b to hold the nuts 3a . . . 3h. Bearing rail 28b fits into channels (not numbered) on the nuts 3a . . . 3h. In contrast to dove tail 28, bearing rail 28b is placing force on the nuts 3a . . . 3h at two points coplanar with shaft 1. This arrangement prevents pitching of the nuts 3a . . . 3h as they move along shaft 1, thereby reducing wear and increasing accuracy. The drawback of bearing rail 28b in comparison to dove tail 28 is that it takes up more space. The added space could be a detriment if multiple expanding grippers are used in a two dimensional array as, for example in FIG. 6.

Figure 6:
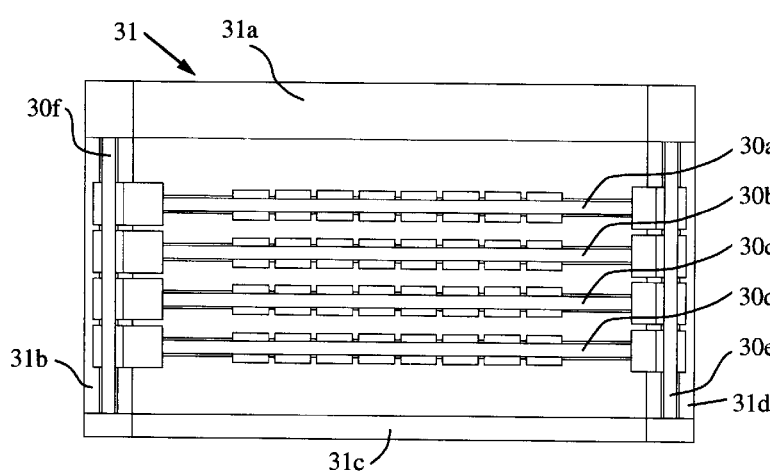
FIG. 6 is a top view of a two dimensional expanding pick and place mechanism.

FIG. 6 shows four expanding grippers 30a . . . 30d mounted side by side in a frame 31 having sides 31a . . . 31d. Such a configuration would be useful to pick up a 4×8 array of components.

Sides 31b and 31d are in turn made up of systems 30e and 30f, which are also expandable. Systems 30e and 30f are made of nuts (not numbered) having threads with different leads in the same way that expanding gripper 30 is made. However, rather than mounting pick and place devices, such as 4a . . . 4h, to those nuts, bearing supports 7 and motors 21 of expanding grippers 3a . . . 30d are attached to them.

The embodiment of FIG. 5 allows the pitch of components held by expanding grippers 30a . . . 30d to be expanded in two dimensions. By rotating the shafts of expanding grippers 30a . . . 30d, the pitch can be expanded in one direction. By rotating the shafts of systems 30e and 30f, the pitch can be expanded in a perpendicular direction.

Figure 7:
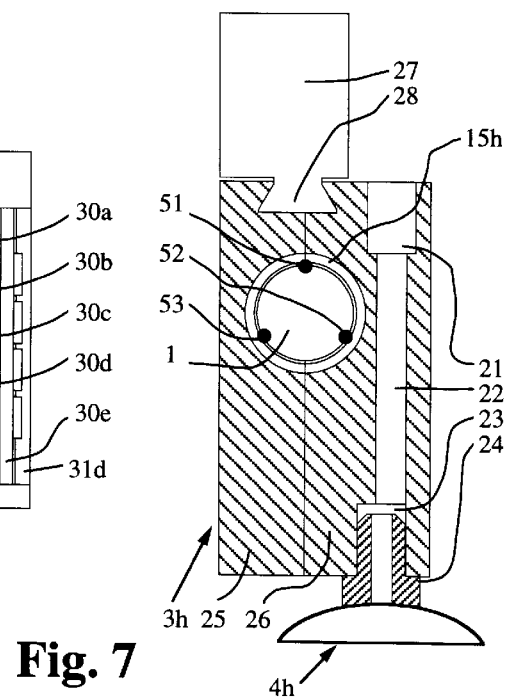
FIG. 7 is a cross sectional view of a pick and place mechanism incorporating an alternative embodiment of the invention.

Turning to FIG. 7, an alternative embodiment of expanding gripper 30 is shown. Rather than a continuous compliant layer 2, three strips of compliant material 51, 52 and 53 are embedded in the surface of shaft 1. The strips of compliant material 51, 52 and 53 will still conform to the threads, such as 15g and 15h to drive the nuts 3a . . . 3h along the length of the shaft. However, because the surface area of the compliant layer in contact with the threads is reduced, the deformation force is reduced, and the friction is also reduced. More strips of compliant material could be used if desired, A likely application of either expanding gripper 30 (FIG. 2) or frame 31 containing multiple expanding grippers is in a semiconductor handling device. Expanding gripper 30 would be mounted on a stage (not shown) that moves in at least two directions. In operation, the stage would be moved above a transport tray and then lowered to make contact with semiconductor components in the transport tray. The pick and place mechanisms 4a . . . 4h would then be actuated to pick up semiconductor components.

The stage would then be raised. In the raised position, shaft 1 would be rotated until the semiconductor components were on the desired pitch. The stage would then be moved over a machine tray and lowered. The pick and place mechanisms 4a . . . 4h would then be actuated to release the semiconductor components into the machine tray.

The stage would then be moved back over the transport tray and the shaft rotated in the opposite direction until the pitch of the pick and place devices matches the pitch of components in the transport tray. The process would then be repeated to move another group of semiconductor components.

The foregoing description has focused on the inventive concepts of the design. It will be appreciated by one of skill in the art that routine elements normally found in a semi-conductor processing device would likely be included. For example, devices to move transport trays and machine trays have not been described. Tray magazines or other known tray handling devices would likely be used with the invention.

Further, routine elements, such as control wiring and vacuum hoses have not been expressly shown for simplicity. However, it will be appreciated by one of skill in the art that such elements are required. Position sensing elements and a feedback control system are also not shown, but are routinely used in machinery of the type described herein.

Having described one embodiment, numerous alternative embodiments or variations might be made. For example, it was described that the invention is useful for transferring semiconductor components from a transport tray to a machine tray. It might also be used to transfer components from a machine tray to a transport tray.

As another example, it was described that the variable lead threads were placed on nuts and a compliant member was placed on a shaft. The invention could be made to work the same if the shaft had a thread of variable lead along its length and the nuts included a compliant member pressed against the thread. However, this approach is not presently preferred because of the added complexity of forming a shaft with a variable lead thread.

Also, high-rebound rubber was given as an example of the compliant material 2. Other elastomeric materials, such as silicone compounds, might be used or other forms of compliant materials might be used. For example, the compliant layer 2 might be formed using relatively stiff bristles.

Moreover, it is described that the threads 15 are sinusoidal to avoid cutting the compliant material 2. If bristles are used to form the compliant material, a standard ACME thread might be used. A standard ACME thread might also be used where wear of the compliant material is not as great a concern.

As an example of another variation, it was described that shaft 1 rotates and nuts 3a . . . 3h do not rotate. While this arrangement is preferred because of ease of manufacture, one of skill in the art will appreciate that the benefits of the invention are obtained by relative rotation of shaft 1 and the threads such as 15g and 15h. Relative rotation could be obtained by holding shaft 1 fixed and rotating the threaded portions of the nuts.

A still further variation would be to have the shaft smooth with each nut containing a plurality of rollers around the shaft. The rollers would have an outer surface adapted to provide traction with the shaft. The rollers on each nut would be positioned to engage the shaft as a traction screw. The orientation of the rollers for each nut could be varied such that each nut effectively had a different pitch.

Therefore, the invention should be limited only by the spirit and scope of the appended claims.

What is claimed is:

1. Semiconductor processing equipment incorporating apparatus for varying the spacing between a plurality of points, the apparatus comprising:
    a) a shaft;
    b) a plurality of bodies each having an inner surface encircling and facing the shaft at points along the length of the shaft, the plurality of bodies defining the said plurality of points;
    c) a compliant material disposed between the shaft and the plurality of bodies; and
    d) wherein one of the shaft and the inner surfaces of the plurality of bodies contains variable lead threads engaging the compliant material such that the lead of the thread is different at the plurality of points.

2. The semiconductor processing equipment of claim 1 additionally comprising a plurality of pick and place mechanisms, each attached to one of the plurality of bodies.

3. The semiconductor processing equipment of claim 1 wherein the compliant material comprises rubber.

4. The semiconductor processing equipment of claim 1 wherein the compliant material comprises a coating on the shaft.

5. The semiconductor processing equipment of claim 1 wherein the compliant material comprises a plurality of strips of complaint material disposed along the length of the shaft.

6. The semiconductor processing equipment of claim 1 wherein the variable lead threads are on the inner surface of the plurality of bodies.

7. The semiconductor processing equipment of claim 6 wherein the thread on the inner surface of each of the plurality of bodies has a different lead.

8. The semiconductor processing equipment of claim 7 wherein the lead of the thread in each of the plurality of bodies differs from the lead of the thread in an adjacent one of the plurality of bodies by a fixed amount.

9. The semiconductor processing equipment of claim 1 wherein said apparatus for varying spacing comprises a first apparatus for varying spacing and additionally comprising:
    a) a second apparatus for varying spacing between a plurality of points, said second apparatus comprising a second shaft disposed parallel with the shaft of the first apparatus for varying spacing and a plurality of bodies mounted to the shaft;
    b) an additional plurality of apparatus for varying spacing between a plurality of points, each of the additional plurality of apparatus attached to one of the plurality of bodies of the first apparatus for varying the spacing and one of the plurality of bodies in the second apparatus for varying spacing.

10. The semiconductor processing equipment of claim 9 additionally comprising a plurality of pick and place mechanisms, each attached to one of the plurality of bodies of the additional plurality of apparatus.

11. Semiconductor processing equipment of the type receiving a transfer tray of semiconductor components and transferring the semiconductor components to a machine tray, each tray holding the semiconductor components spaced apart with a predetermined pitch, with the pitch of the transfer tray being different than the pitch of the machine tray, the semiconductor processing equipment incorporating an expandable gripper configured to transfer semiconductor components between the transfer tray and the machine tray, the expandable gripper comprising:

a) a shaft;

b) a plurality of pick and place mechanisms each having an inner surface encircling and facing the shaft at points along the length of the shaft;

c) a compliant material disposed between the shaft and the plurality of bodies; and d) wherein one of the shaft and the inner surfaces of the pick and place mechanisms contains variable lead threads engaging the compliant material.

12. The semiconductor processing equipment of claim 11 additionally comprising a motor coupled to rotate the shaft.

13. The semiconductor processing equipment of claim 12 additionally comprising means for restraining rotation of the plurality of pick and place mechanisms while allowing translational motion along the shaft.

14. The semiconductor processing equipment of claim 11 additionally comprising a plurality of like expandable grippers, the shafts of each of the expandable grippers being parallel.

15. The semiconductor processing equipment of claim 11 wherein the compliant material comprises an elastomer.

16. Semiconductor processing equipment incorporating an expandable positioning apparatus, the expandable positioning apparatus comprising:

a) a shaft;

b) a plurality of threaded nuts around the shaft, the threads of each of the nuts having a different lead;

c) compliant material between the threads and the shaft; and d) a plurality of pick and place mechanisms, each coupled to one of the plurality of threaded nuts.

17. The semiconductor processing equipment of claim 16 wherein the compliant material is rubber and the threads are sinusoidal threads.

* * * * *